United States Patent [19]
Kimura et al.

[11] Patent Number: 5,590,942
[45] Date of Patent: Jan. 7, 1997

[54] POLARIZING CONVERSION UNIT, ILLUMINATING DEVICE AND PROJECTOR USING THEM

[75] Inventors: Kazumi Kimura, Atsugi; Hideaki Mitsutake, Tokyo; Shigeru Kawasaki, Kawasaki, all of Japan

[73] Assignee: Canon Kabushiki Kaisha, Tokyo, Japan

[21] Appl. No.: 118,460

[22] Filed: Sep. 8, 1993

[30] Foreign Application Priority Data

Sep. 11, 1992 [JP] Japan .................................. 4-243703

[51] Int. Cl.⁶ .............................................. G03B 21/00
[52] U.S. Cl. .................. 353/34; 353/20; 353/37; 353/98; 359/487; 349/5
[58] Field of Search ............................. 353/31, 20, 33, 353/34, 37, 81, 98, 38; 359/40, 496, 837, 834, 833, 487; 362/297

[56] References Cited

U.S. PATENT DOCUMENTS 3,620,592  11/1971  Freeman ........................ 353/99
4,088,301  3/1992   Kurematsu ...................... 359/496
4,556,292  12/1985  Mathyssek et al. .............. 359/487
5,040,871  8/1991   Davie et al. .................... 359/458
5,124,841  6/1992   Oishi ............................ 359/496
5,295,018  3/1994   Konuma et al. ................. 359/496

FOREIGN PATENT DOCUMENTS

434041A1  6/1991   European Pat. Off. .
456427A3  11/1991  European Pat. Off. .
457605A3  11/1991  European Pat. Off. .
492636A1  7/1992   European Pat. Off. .
61-90584  5/1986   Japan .

*Primary Examiner*—William Dowling
*Attorney, Agent, or Firm*—Morgan & Finnegan, L.L.P.

[57] ABSTRACT

A polarizing conversion unit is disclosed. The unit is provided with a polarizing beam splitter for separating light from a light source into first and second polarized lights differing in polarized state from each other, polarizing conversion means for varying the polarized state of the first polarized light and making it substantially coincident with the polarized state of the second polarized light, and reflecting means for reflecting the first or second polarized light, at least a portion of that surface of the outer peripheral portion of the polarizing conversion unit which is parallel to the optical path of the light functioning as a reflection surface.

8 Claims, 9 Drawing Sheets

POLARIZING CONVERSION UNIT, ILLUMINATING DEVICE AND PROJECTOR USING THEM

BACKGROUND OF THE INVENTION

1. Field of the Invention

This invention relates to an illuminating device, and a polarizing illuminating device and a projector using them.

2. Related Background Art

FIG. 1 of the accompanying drawings shows the construction of the essential portions of a projector according to the prior art.

This projector comprises a light source 10511 comprising a halogen lamp, a metal halide lamp or the like emitting non-polarized light, a reflecting mirror 10512 for reflecting part of the non-polarized light emitted from the light source 10511, a heat ray cutting filter 10513 for absorbing or reflecting the heat rays of the non-polarized light incident directly from the light source 10511 or through the reflecting mirror 10512, a condenser lens 10514 for converting the non-polarized light having its heat rays removed therefrom into non-polarized parallel light, a polarizing plate 10515 for converting the non-polarized parallel light into linearly polarized light, a liquid crystal light valve 10517 which is an image generator for modulating the linearly polarized light in conformity with a video signal to thereby generate an image, a polarizing plate 10518 for transmitting therethrough only the component in the direction of the transmission axis of the linearly polarized light modulated by the liquid crystal light valve 10517, and a projection lens 10520 which is a projection optical system for projecting the linearly polarized light transmitted through the polarizing plate 10518 onto a screen (not shown) and projecting said image.

FIG. 2 of the accompanying drawings shows the construction of the essential portions of another projector according to the prior art.

This projector has two polarizing beam splitters 10516 and 10519, instead of the two polarizing plates 10515 and 10518 of the projector shown in FIG. 1, disposed forwardly and rearwardly of the liquid crystal light valve 10517.

In the projectors shown in FIGS. 1 and 2, of the non-polarized light emitted from the light source 10511, only the linearly polarized light transmitted through the polarizing plate 10515 or the polarizing beam splitter 10516 is utilized as illuminating light for the liquid crystal light valve 10517, and this leads to a problem that the linearly polarized light not transmitted through the polarizing plate 10515 or the polarizing beam splitter 10516 is lost and the utilization efficiency of the light becomes 50% or less. FIG. 3 of the accompanying drawings shows a projector which eliminates such problem.

In this projector, non-polarized parallel light emerging from the condenser lens 10514 enters a polarizing beam splitter 10521, and P-polarized light $L_P$ is intactly transmitted through the acting surface 10521a of the polarizing beam splitter 10521 (deposited film formed on the slopes of two rectangular prisms which are adhesively secured to each other) and S-polarized light $L_S$ is upwardly reflected at a right angle as viewed in FIG. 3 and enters a total reflection prism 10522. The S-polarized light $L_S$ is rightwardly reflected at a right angle by the total reflection prism 10522 as viewed in FIG. 3, whereby it emerges from the total reflection prism 10522 in the same direction as the P-polarized light $L_P$ transmitted through the polarizing beam splitter 10521. Here, the S-polarized light $L_S$ refers to linearly polarized light having a plane of polarization parallel to the acting surface 10521a of the polarizing beam splitter 10521, and the P-polarized light $L_P$ refers to linearly polarized light having a plane of polarization orthogonal to the S-polarized light $L_S$. A half wavelength plate 10523 is disposed on the exit side of the total reflection prism 10522, and the S-polarized light $L_S$ emerging from the total reflection prism 10522 is transmitted through the half wavelength plate 10523, whereby it has its plane of polarization rotated by 90° and is converted into P-polarized light $L_P^*$. Also, wedge type lenses 10524 and 10525 for changing the optical path are disposed on the exit sides of the polarizing beam splitter 10521 and the half wavelength plate 10523, respectively, whereby the P-polarized light $L_P$ transmitted through the polarizing beam splitter 10521 and the P-polarized light $L_P^*$ converted by the half wavelength plate 10523 have their optical paths changed and intersect each other at a point $P_0$ on the entrance side surface of a liquid crystal light valve 10527 and become combined light.

Accordingly, in this projector, the liquid crystal light valve 10527 can be illuminated by both of the S-polarized light $L_S$ and the P-polarized light $L_P$ separated by the polarizing beam splitter 10521 and therefore, the utilization efficiency of the light can be made better than in the projectors shown in FIGS. 1 and 2.

However, in the projector shown in FIG. 3, that surface of the polarizing beam splitter 10521 which is in contact with the total reflection prism 10522 and the surface thereof opposed to that contact surface have nothing to do with the optical path of the non-polarized parallel light entering the polarizing beam splitter 10521 and therefore are made into rough surfaces. On the other hand, where the light source 10511 has a finite size, the non-polarized parallel light emerging from the condenser lens 10514 does not become completely parallel light and enters the polarizing beam splitter 10521 with a certain angle of expanse. As a result, the non-polarized parallel light is incident on said contact surface of the polarizing beam splitter 10521 and the surface thereof opposed to said contact surface and is scattered thereby before and after it is incident on the acting surface 10521a of the polarizing beam splitter 10521, and this leads to a problem that the quantity of light is lost.

Also, to prevent such loss of the quantity of light, there is a problem that the size of the polarizing beam splitter 10521 must be made considerably large relative to the effective irradiation area of the non-polarized parallel light emerging from the condenser lens 10514.

It is a first object of the present invention to provide a polarizing illuminating device which can prevent any loss of the quantity of light and a projector provided with such device.

In a projector using a light modulating element such as liquid crystal, as previously described, image forming means such as a liquid crystal device (LCD) is illuminated by illuminating light provided by an illuminating optical device comprised of a light source, a reflector, etc., and the image thereof is enlargedly projected onto a screen by a projection lens. As a method of improving the utilization efficiency of radiation emitted from the light source, there has been proposed a method as shown, for example, in FIGS. 4 and 5 of the accompanying drawings wherein unutilized light which does not reach the image forming means is imaged near the light source and is reutilized as a secondary light source.

In the method shown in FIG. 4, radiation emitted from a light source 10601 is converted into substantially parallel light (hereinafter referred to as the "parallel light") by a parabolic reflector 10602. A plane mirror 10604 is provided around a liquid crystal device 10603, and of the parallel light emerging from the parabolic reflector 10602, parallel light $L_{2G}$ directly incident on the plane mirror 10604 is reflected toward the parabolic reflector 10602 by the plane mirror 10604 and forms the image of the light source 10601 near the focus of the parabolic reflector 10602. With this image as a secondary light source, the parallel light $L_{2G}$ is again converted into parallel light $L_{2G}'$ by the parabolic reflector 10602, whereby it becomes illuminating light for the liquid crystal device 10603. The light source 10601 is provided near the focus of the parabolic reflector 10602, and the radiation emitted from the light source 10601 is reflected by the parabolic reflector 10602 to thereby provide parallel lights $L_{1G}$ and $L_{2G}$.

The reasons why besides the parallel light $L_{1G}$ directly illuminating the liquid crystal device 10603, the parallel light $L_{2G}$ illuminating the other portion than the liquid crystal device 10603 exists in the parallel light emerging from the parabolic reflector 10602 are:

(1) that the parabolic reflector 10602 usually has a rotation-symmetrical shape and therefore the cross-section of the illuminating light emerging from the parabolic reflector 10602 is circular, whereas the shape of the liquid crystal device 10603 is rectangular; and (2) that the vicinity of the center of the illuminating light assumes higher luminance than the marginal portion thereof and therefore it is more advantageous for the heightening of the luminance of the image enlargedly projected onto a screen to provide the liquid crystal device 10603 (illuminated member) in the central portion of the illuminating light.

As previously described, the liquid crystal device usually has a polarizer and a polarizing plate called an analyzer forwardly and rearwardly thereof, and in a liquid crystal projector, more than half of illuminating light is absorbed by the polarizer and lost, and a polarizing illuminating device improved in this point is shown in FIG. 5.

Radiation emitted from a light source 10611 is converted into substantially parallel light by a parabolic reflector 10612. Of this parallel light, P-polarized light $L_P$ is transmitted through a polarizing beam splitter 10613 and S-polarized light $L_S$ is downwardly reflected at a right angle by the polarizing beam splitter 10613 as viewed in FIG. 5, whereby the parallel light is separated into P-polarized light $L_P$ and S-polarized light $L_S$ by the polarizing beam splitter 10613. Here, the P-polarized light $L_P$ refers to linearly polarized light perpendicular to the direction of travel and parallel to the plane of the drawing sheet of FIG. 5, and the S-polarized light refers to linearly polarized light perpendicular to both of the direction of travel and the plane of the drawing sheet of FIG. 5. The P-polarized light $L_P$ transmitted through the polarizing beam splitter 10613 is utilized as polarized illuminating light for a liquid crystal device (not shown) provided at the left of the polarizing beam splitter 10613 as viewed in FIG. 5. On the other hand, the S-polarized light $L_S$ reflected by the polarizing beam splitter 10613 is upwardly reflected as viewed in FIG. 5 by a plane mirror 10614 provided below the polarizing beam splitter 10613, whereafter it again enters the polarizing beam splitter 10613 and follows an optical path opposite to the forward route and returns to the vicinity of the focus of the parabolic reflector 10612. As a result, the image of the light source 10611 is formed near the focus of the parabolic reflector 10612, and with this image as a secondary light source, the S-polarized light $L_S$ is again converted into parallel light $L_G'$ by the parabolic reflector 10612 and enters a polarizing beam splitter 10613. At this time, the S-polarized light $L_S$ has its polarization disturbed by the light source 10611 and reflector 10612 and therefore, the parallel light $L_G'$ converted by the parabolic reflector 10612 becomes light including P-polarized light and behaves similarly to the light emitted from the aforementioned light source 10611. Assuming that by the above-described operation being repeated, there is no loss by the reflection on the parabolic refector 10612 and plane mirror 10614, the radiation emitted from the light source 10611 can all be utilized as polarized illuminating light for the liquid crystal device.

However, the above-described method of improving the utilization efficiency of the radiation emitted from the light source suffers from a problem as shown below.

As shown in FIG. 6 of the accompanying drawings, the light source 10621 actually has a finite size and therefore, the light emerging from the parabolic reflector 10622 does not become completely parallel light. Assuming that the distance from the focus F of the parabolic reflector 10622 to any reflection point K on the parabolic reflector 10622 is D and the diameter of the light source 10621 is 2r, the light reflected at the reflection point K is cone-shaped light of $\pm\theta \cong \tan^{-1}(r/D)$. As typical ones of such light, there are light $L_{C1}$ and light $L_{C2}$ as shown in FIG. 6. The light $L_{C1}$ has an angle of $\theta_1$ with respect to the central ray and therefore, the angle of incidence and the angle of reflection at a reflection point $K_1$ and both $\theta_1$. Accordingly, even when the light $L_{C1}$ emerges from the parabolic reflector 10622 and is reflected by the plane mirror 10623 and thereafter is returned to the parabolic reflector 10622, the light $L_{C1}$ has an angle of $\theta_1$ with respect to a line linking a reflection point $K_1'$ on the parabolic reflector 10622 and the focus F of the parabolic reflector 10622 together and therefore, the light $L_{C1}$ is again returned to a place considerably far from the light source 10621 with a result that the size of the secondary light source becomes large. When the size of the secondary light source becomes large, the angle $\theta$ represented by $\pm\theta \cong \tan^{-1}(r/D)$ also becomes large and therefore, the light is eclipsed by the pupil of a projection lens, not shown, and the efficient utilization of the radiation emitted from the light source 10621 cannot be attained. Also, the other light $L_{C2}$ becomes lost light because it is not reflected toward the parabolic reflector 10622 by the plane mirror 10623. This is because the light $L_{C2}$ has an angle $\theta_2$ with respect to the central ray and therefore is incident on the plane mirror 10623 at an angle of incidence $\theta_2$ and thereafter is reflected at an angle of reflection $\theta_2$.

It is a second object of the present invention to provide an illuminating optical device and a projector in which the utilization efficiency of light can be improved.

SUMMARY OF THE INVENTION

A first form of the present invention for achieving the above objects is a polarizing illuminating device having a polarizing beam splitter having an acting surface for separating non-polarized light incident thereon into a pair of polarized lights, a polarizing conversion element for changing the direction of polarization of one of said pair of polarized lights and making it substantially equal to the direction of polarization of the other polarized light, and reflecting means for reflecting one of said pair of polarized lights, characterized in that an incidence surface on which said non-polarized light is incident, an emergence surface from which the pair of polarized lights made equal in the direction of polarization and a surface parallel to the optical axis of said non-polarized light are polished into mirror surfaces.

At least one of said incidence surface and said emergence surface may comprise a transparent light refractive index optical member, instead of being polished into a mirror surface.

A second form of the present invention for achieving the above object is an illuminating device for illuminating an object to be illuminated by light from a light source having a reflector behind it, characterized by an optical member for changing the direction of travel of the light travelling along the other portion than the area of said object to be illuminated by 180°. The optical member may be a corner cube array or a cat's eye optical system.

DESCRIPTION OF THE PREFERRED EMBODIMENTS

Figure 7:
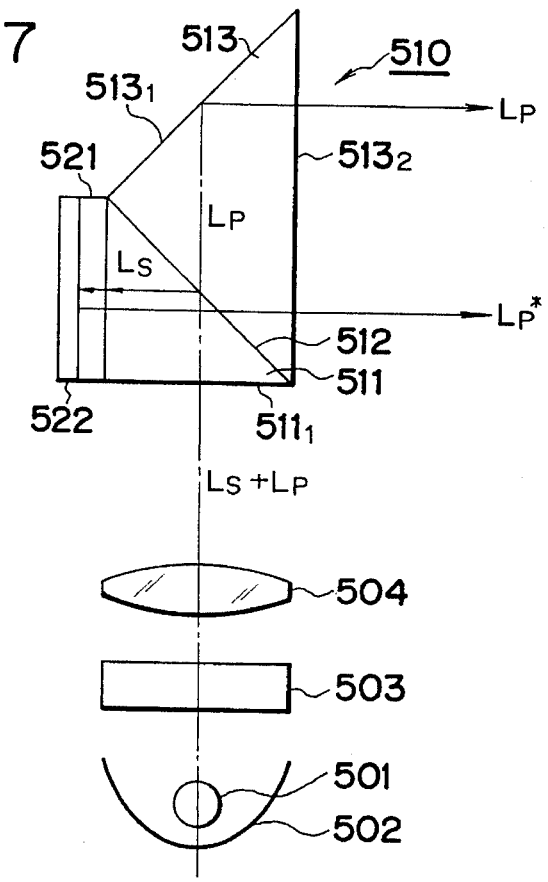
FIG. 7 shows an embodiment of the polarizing illuminating device of the present invention.
Figure 8:
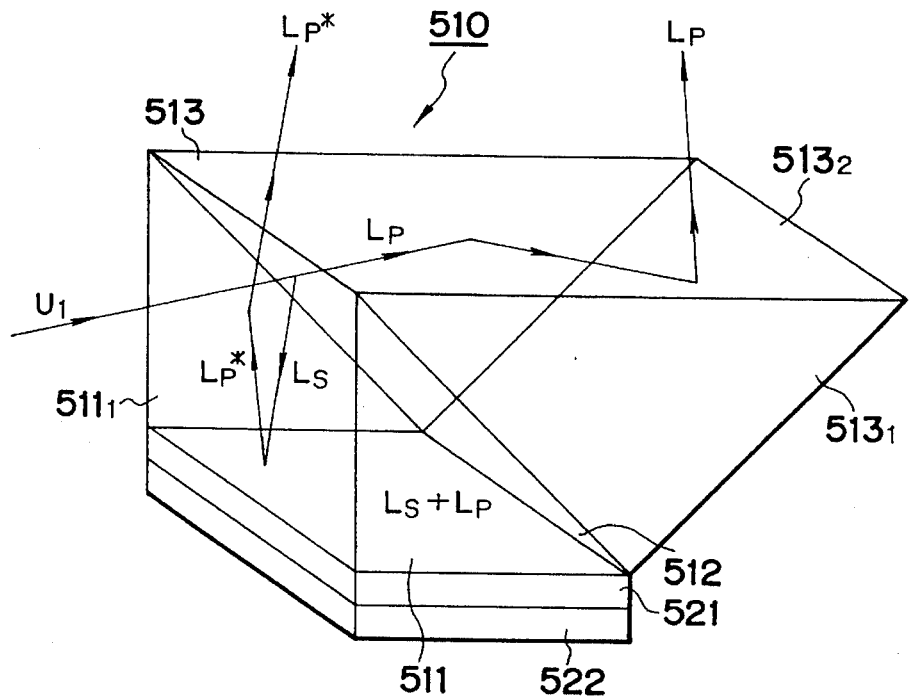
FIG. 8 illustrates an optical path in the embodiment of FIG. 7.

FIG. 7 schematically shows the construction of a first embodiment of the polarizing illuminating device of the present invention, and FIG. 8 illustrates an optical path in the polarizing illuminating device of FIG. 7.

The polarizing illuminating device of the present embodiment comprises a polarizing beam splitter 510, a quarter wavelength optical phase plate 521 and a reflecting plate 522.

The polarizing beam splitter 510 is comprised of a first rectangular prism 511 having an incidence surface $511_1$ onto which non-polarized parallel light $L_P+L_S$ is incident from a condenser lens 504 and having its whole surface polished into a mirror surface, an acting surface 512 formed on the slope of a first triangular prism 511 for transmitting the P-polarized light $L_P$ of the non-polarized parallel light $L_P+L_S$ therethrough and reflecting the S-polarized light $L_S$ of the non-polarized parallel light $L_P+L_S$ at a right angle to thereby separate the non-polarized parallel light $L_P+L_S$ into the P-polarized light $L_P$ and the S-polarized light $L_S$, and a second rectangular prism 513 having an emergence surface $513_2$ and a total reflection surface $513_1$ for reflecting the P-polarized light $L_P$ transmitted through the acting surface 512 toward the emergence surface $513_2$ and having its whole surface polished into a mirror surface. That is, the polarizing beam splitter 510 has both of the function as a polarizing beam splitter having an acting surface for separating incident non-polarized light into two polarized lights differing in the direction of polarization from each other and the function as reflecting means for reflecting one of the two polarized lights made equal in the direction of polarization to each other.

The quarter wavelength optical phase plate 521 is provided on that surface of the first rectangular prism 511 which is opposite to the emergence surface $513_2$ so that the S-polarized light $L_S$ reflected by the acting surface 512 may enter perpendicularly. The reflecting plate 522 has a reflecting surface (formed of deposited aluminum coating or optical multi-layers) adhesively secured to that surface of the quarter wavelength optical phase plate 521 which is opposite to the first rectangular prism 511. The quarter wavelength optical phase plate 521 and reflecting plate 522, as will be described later, have the function as a polarization direction rotating optical element for rotating the direction of polarization of the S-polarized light $L_S$ by approximately 90° and making it equal to the direction of polarization of the P-polarized light $L_P$.

Description will now be made of the operation of the polarizing illuminating device of the present embodiment.

Where a light source 501 is an ideal point light source, the non-polarized parallel light $L_P+L_S$ emerging from the condenser lens 504 becomes completely parallel light. The non-polarized parallel light $L_P+L_S$ is incident on the incidence surface $511_1$ of the first rectangular prism 511, whereafter the P-polarized light $L_P$ is transmitted through the acting surface 512 and the S-polarized light $L_S$ is reflected leftwardly at a right angle as viewed in FIG. 7, whereby the non-polarized parallel light $L_P+L_S$ is separated into the P-polarized light $L_P$ and the S-polarized light $L_S$. The S-polarized light $L_S$ enters the quarter wavelength optical phase plate 521 perpendicularly thereto and is transmitted through the quarter wavelength optical phase plate 521, whereafter it is reflected by the reflecting plate 522 and is again transmitted through the quarter wavelength optical phase plate 521, whereby it has its direction of polarization rotated by 90° and is converted into P-polarized light $L_P^*$. The converted P-polarized light $L_P^*$ is transmitted through the acting surface 512, whereafter it emerges from the lower portion of the emergence surface $513_2$ of the second rectangular prism 513 as viewed in FIG. 7.

On the other hand, the P-polarized light $L_P$ transmitted through the acting surface 512 is reflected rightwardly at a right angle by the total reflection surface $513_1$ of the second rectangular prism 513 as viewed in FIG. 7, whereafter it emerges from the upper portion of the emergence surface of the second rectangular prism 513 as viewed in FIG. 7.

However, where the light source 501 is not an ideal point light source, the non-polarized parallel light $L_P+L_S$ emerging from the condenser lens 504 does not become completely parallel light and there exists also non-polarized light $U_1$ incident on the incidence surface $511_1$ of the first rectangular prism 511 obliquely thereto. The optical path of the non-polarized light $U_1$ in the polarizing illuminating device will hereinafter be described with reference to FIG. 8.

The non-polarized light $U_1$ shown in FIG. 8 is refracted by the incidence surface $511_1$ of the first rectangular prism 511, and thereafter is incident on the acting surface 512. The non-polarized light $U_1$ incident on the acting surface 512 has its P-polarized light $L_P$ transmitted through the acting surface 512 and its S-polarized light $L_S$ reflected downwardly as viewed in FIG. 8, whereby it is separated into the P-polarized light $L_P$ and the S-polarized light $L_S$. Thereafter, the P-polarized light $L_P$ impinges on the emergence surface $513_2$ of the second rectangular prism 513, but the emergence surface $513_2$ is polished and therefore, the P-polarized light $L_P$ is not scattered by the emergence surface $513_2$ but is totally reflected thereby and travels toward the total reflection surface $513_1$ of the second rectangular prism 513. Thereafter, the P-polarized light $L_P$ is reflected upwardly by the total reflection surface $513_1$ as viewed in FIG. 8, and emerges from the right portion of the emergence surface $513_2$ as viewed in FIG. 8.

On the other hand, the S-polarized light $L_S$ is transmitted through the quarter wavelength optical phase plate 521, whereafter it is reflected by the reflecting plate 522 and is again transmitted through the quarter wavelength optical phase plate 521, whereby it has its direction of polarization rotated by 90° and is converted into P-polarized light $L_P^*$. The converted P-polarized light $L_P^*$ impinges on the incidence surface $511_1$ of the first rectangular prism 511, but the incidence surface $511_1$ is polished and therefore, the P-polarized light $L_P^*$ is not scattered by the incidence surface $511_1$ but is totally reflected thereby and travels toward the acting surface 512. Thereafter, the converted P-polarized light $L_P$ is transmitted through the acting surface 512, whereafter it emerges from the left portion of the emergence surface $513_2$ of the second rectangular prism 513.

Accordingly, in the polarizing illuminating device of the present embodiment, by the whole surfaces of the first and second rectangular prisms 511 and 512 being polished, even where the light source 501 is not an ideal point light source, all non-polarized light incident on the incidence surface $511_1$ of the first rectangular prism 511 can be caused to emerge from the emergence surface $513_2$ of the second rectangular prism 513 without any loss of the quantity of light and without its polarized state being destroyed. As a result, the polarizing beam splitter 510 can be constructed of a minimum size and thus, the compactness of the entire device can also be achieved.

Figure 9A:
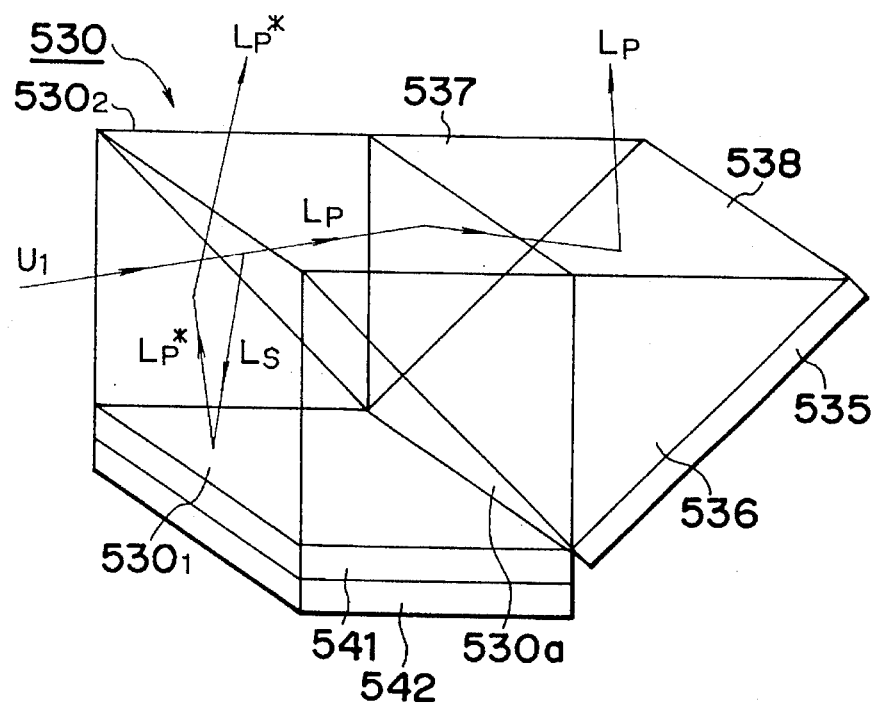
FIGS. 9A and 9B show another embodiment of the polarizing illuminating device of the present invention.
Figure 9B:
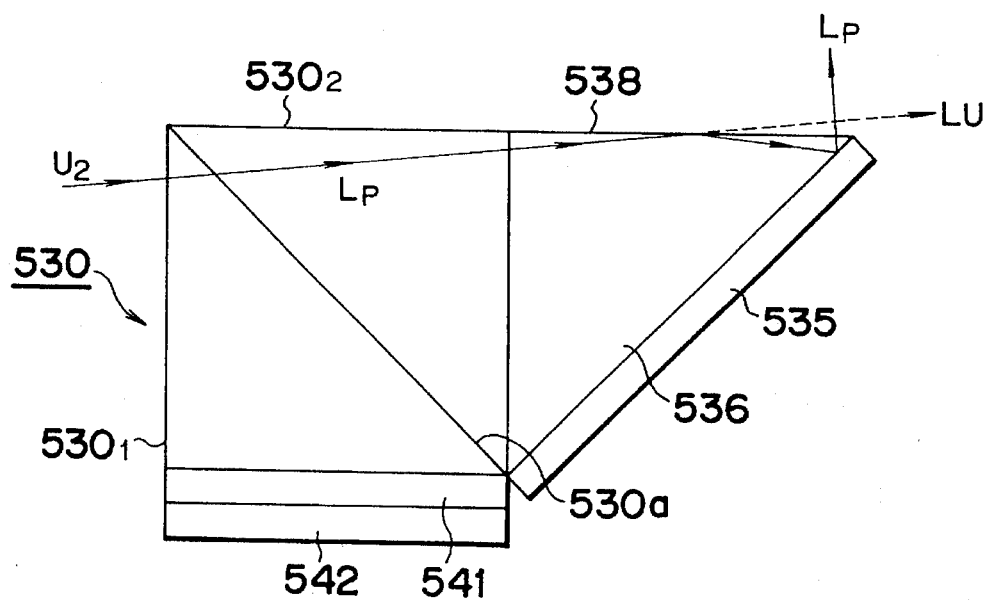

FIGS. 9A and 9B schematically show the construction of a second embodiment of the polarizing illuminating device of the present invention.

The polarizing illuminating device of the present embodiment, as shown in FIG. 9A, comprises a polarizing beam splitter 530, first to third reflecting mirrors 535 to 537, an optical member 538, a quarter wavelength optical phase plate 541 and a reflecting plate 542. The polarizing beam splitter 530 is of the cubic type and has an incidence surface $530_1$ on which non-polarized parallel light is incident, an emergence surface $530_2$ in contact with the incidence surface $530_1$ at an angle of 90°, and an acting surface 530a for transmitting the P-polarized light $L_P$ of the non-polarized parallel light therethrough and reflecting the S-polarized light $L_S$ of the non-polarized parallel light to thereby separate the non-polarized parallel light into the P-polarized light $L_P$ and the S-polarized light $L_S$, and also has its whole surface polished.

The first reflecting mirror 535 is formed of a metal coating surface such as aluminum coating or optical multi-layers, and is provided on the side opposite to the incidence surface $530_1$ of the polarizing beam splitter 530 so that the P-polarized light $L_P$ transmitted through the acting surface 530a of the polarizing beam splitter 530 may be incident thereon at an angle of 45°. The first reflecting mirror 535 has the function as reflecting means for reflecting one (here, $L_P$) of the two polarized lights made equal in the direction of polarization to each other.

The quarter wavelength optical phase plate 541 is provided on that surface of the polarizing beam splitter 530 which is opposite to the emergence surface $530_2$ thereof so that the S-polarized light $L_S$ reflected by the acting surface 530a of the polarizing beam splitter 530 may be incident thereon perpendicularly thereto. The reflecting plate 542 has a reflecting surface (formed of aluminum coating or optical multi-layers) adhesively secured to that surface of the quarter wavelength optical phase plate 541 which is opposite to the polarizing beam splitter 530. The quarter wavelength optical phase plate 541 and reflecting plate 542 have the function as a polarization direction rotating optical element for rotating the direction of polarization of the S-polarized light $L_S$ by approximately 90° and making it equal to the direction of polarization of the P-polarized light $L_P$.

The second and third reflecting mirrors 536 and 537 each are formed of a surface of a metal such as aluminum or optical multi-layers, and are provided in opposed relationship with each other between the opposite sides of the polarizing beam splitter 530 and the opposite sides of the first reflecting mirror 535. The optical member 538 is provided on the same plane as the emergence surface $530_2$ of the polarizing beam splitter 530.

That is, the polarizing illuminating device of the present embodiment uses the polarizing beam splitter 530 of the cubic type and the first reflecting mirror 535, in lieu of the polarizing beam splitter 510 in the polarizing illuminating device shown in FIG. 7, thereby reducing the number of prisms used and achieving the light weight and low cost of the device.

Description will now be made of the optical path, within the polarizing illuminating device, of non-polarized light $U_1$ incident on the incidence surface $530_1$ of the polarizing beam splitter 530 obliquely thereto when the light source (not shown) is not an ideal point light source, with reference to FIG. 9A.

The non-polarized light $U_1$ is refracted by the incidence surface $530_1$ of the polarizing beam splitter 530, and thereafter is incident on the acting surface 530a. The non-polarized light $U_1$ incident on the acting surface 530a has its P-polarized light $L_P$ transmitted through the acting surface 530a and its S-polarized light $L_S$ reflected downwardly by the acting surface 530a as viewed in FIG. 9A, whereby it is separated into the P-polarized light $L_P$ and the S-polarized light $L_S$. Thereafter, the P-polarized light $L_P$ impinges on the emergence surface $530_2$ of the polarizing beam splitter 530, but the emergence surface $530_2$ is polished and therefore, the P-polarized light $L_P$ is not scattered by the emergence surface $521_2$, but is totally reflected thereby and travels toward the first reflecting mirror 535. Thereafter, the P-polarized light $L_P$ is reflected upwardly by the first reflecting mirror 535 as viewed in FIG. 9A, whereafter it emerges from the high refractive index optical member 538.

On the other hand, the S-polarized light $L_S$ is transmitted through the quarter wavelength optical phase plate 541 and thereafter is reflected by the reflecting plate 542 and is again transmitted through the quarter wavelength optical phase plate 541, whereby it has its direction of polarization rotated by 90° and is converted into P-polarized light $L_P^*$. The converted P-polarized light $L_P^*$ impinges on the incidence surface $530_1$ of the polarizing beam splitter 530, but the incidence surface $530_1$ is polished and therefore, the converted P-polarized light $L_P^*$ is not scattered by the emergence surface $530_1$, but is totally reflected thereby and travels toward the acting surface 530a. Thereafter, the converted P-polarized light $L_P^*$ is transmitted through the acting surface 530a, and thereafter emerges from the emergence surface $530_2$ of the polarizing beam splitter 530.

Depending on the angle of incidence of the non-polarized light incident on the incidence surface $530_1$ of the polarizing beam splitter 530, the P-polarized light $L_P$ transmitted through the acting surface 530a may in some cases travel toward between the side of the polarizing beam splitter 530 and the side of the first reflecting mirror 535. Such P-polarized light $L_P$, however, is reflected by the second reflecting mirror 536 or the third reflecting mirror 537 and travels toward the first reflecting mirror 535 and is reflected by the first reflecting mirror 535, and thereafter emerges from the optical member 538.

Also, depending on the angle of incidence of the non-polarized light incident on the incidence surface $530_1$ of the polarizing beam splitter 530, the P-polarized light $L_P$ transmitted through the acting surface 530a, like non-polarized light $U_2$ shown in FIG. 9B, may in some cases travel toward the high refractive index optical member 538. Such P-polarized light $L_P$, however, is reflected by total reflection by the optical member 538, travels toward the first reflecting mirror 535 and is reflected by the first reflecting mirror 535, and thereafter emerges from the high refractive index optical member 538. As a result, as indicated by a ray LU in FIG. 9B, the P-polarized light $L_P$ travelling toward the high refractive index optical member 538 can be prevented from intactly emerging from the high refractive index optical member 538.

Accordingly, in the polarizing illuminating device of the present embodiment, by the whole surface of the polarizing beam splitter 530 being polished and use being made of the first to third reflecting mirrors 535 to 537 and the optical member 538, even where the light source is not an ideal point light source, all the non-polarized light incident on the incidence surface $530_1$ of the polarizing beam splitter 530 can be made to emerge from the emergence surface $530_2$ of the polarizing beam splitter 530 or the optical member 538 without any loss of the quantity of light and without its polarized state being destroyed.

Figure 10:
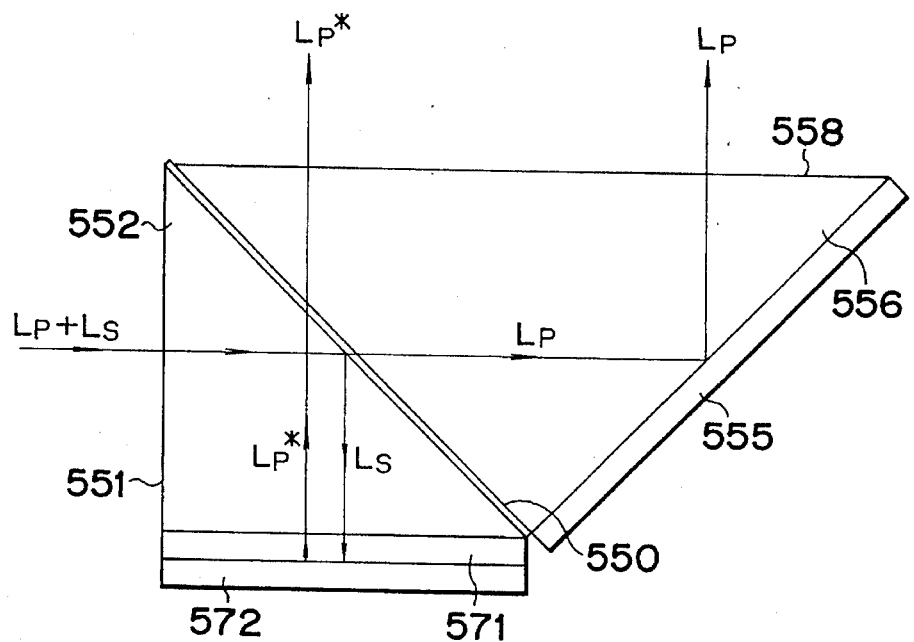
FIG. 10 shows still another embodiment of the polarizing illuminating device of the present invention.

FIG. 10 schematically shows the construction of a third embodiment of the polarizing illuminating device of the present invention.

The polarizing illuminating device of the present embodiment differs in the following points from the polarizing illuminating device shown in FIG. 7.

(1) It includes, instead of the first rectangular-prism 511 shown in FIG. 7, a first optical member 551 forming an incidence surface for non-polarized parallel light $L_P+L_S$, a first incidence side reflecting mirror 552 comprising a right-angled triangular plate having a side in contact with a side on this side of the first optical member 551 as viewed in FIG. 10, and a second incidence side reflecting mirror 553 (not shown) having a side in contact with an inner side of the first optical member 551 as viewed in FIG. 10 and opposed to the first incidence side reflecting mirror 552.

(2) It includes, instead of the acting surface 512 shown in FIG. 7, a plate-like polarizing beam splitter 550 having an acting surface (not shown) for transmitting the P-polarized light $L_P$ of the non-polarized parallel light therethrough and reflecting the S-polarized light $L_S$ of the non-polarized parallel light at a right angle to thereby separate the non-polarized parallel light $L_P+L_S$ into the P-polarized light $L_P$ and the S-polarized light $L_S$.

(3) It includes, instead of the second rectangular prism 513 shown in FIG. 7, a first reflecting mirror 555 provided so that the P-polarized light $L_P$ transmitted through the plate-like polarizing beam splitter 550 may be incident thereon at an angle of 45°, second and third reflecting mirrors 556 and 557 (of which the third reflecting mirror 557 is not shown) provided so as to be opposed to each other between the opposite sides of the plate-like polarizing beam splitter 550 and the opposite sides of the first reflecting mirror 555, and a second optical member 558 forming an emergence surface.

The first and second incidence side reflecting mirrors 552 and 553 and the first to third reflecting mirrors 555 to 557 each are formed of a surface of a metal such as aluminum or optical multi-layers.

Again in the polarizing illuminating device of the present embodiment, as in the polarizing illuminating device shown in FIG. 7 and the polarizing illuminating device shown in FIGS. 9A and 9B, even where the light source is not an ideal point light source, the P-polarized light $L_P$ transmitted through the plate-like polarizing beam splitter 550 can be made to travel toward the first reflecting mirror 555 and emerge from the second high refractive index optical member 558 by the first and second incidence side reflecting mirrors 552 and 553, the first and second optical members 551 and 558 and the second and third reflecting mirrors 556 and 557, and the S-polarized light $L_S$ transmitted through the plate-like polarizing beam splitter 550 can be made to travel toward a quarter wavelength optical phase plate 571 and a reflecting plate 572 and be converted into P-polarized light $L_P^*$, and the converted P-polarized light $L_P^*$ can be made to emerge from the second high refractive index optical member 558.

Figure 3:
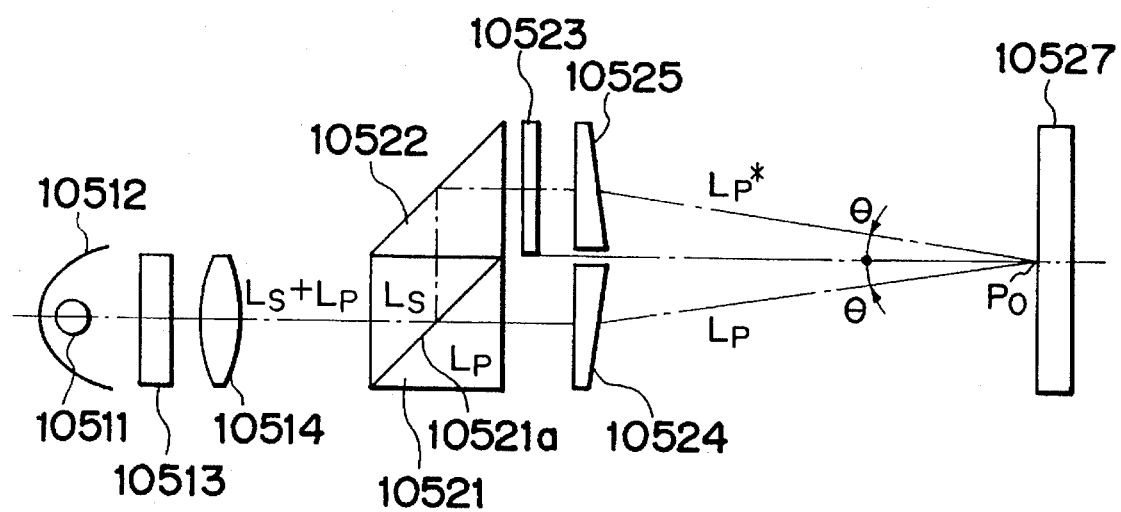
FIG. 3 shows the construction of the essential portions of a projector according to the prior art.

The polarizing illuminating device of the present invention is not restricted to the above-described ones having a polarization direction rotating optical element constituted by the quarter wavelength optical phase plate 521, 541, 571 and the reflecting plate 522, 542, 572, but even in the polarizing illuminating device as shown in FIG. 3 which has a polarization direction rotating optical element constituted by the half wavelength plate 10523, at least portions of the polarizing beam splitter 10521 and total reflection prism 10522 can be polished to thereby obtain a similar effect.

Figure 11:
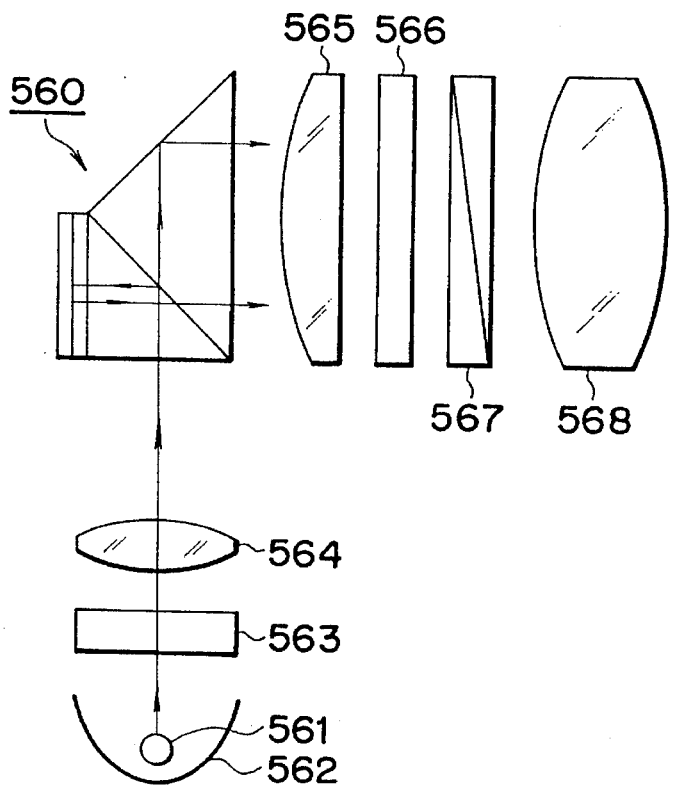
FIG. 11 shows an embodiment of the projector of the present invention.

FIG. 11 shows the construction of the essential portions of an embodiment of a first projector of the present invention.

Figure 1:
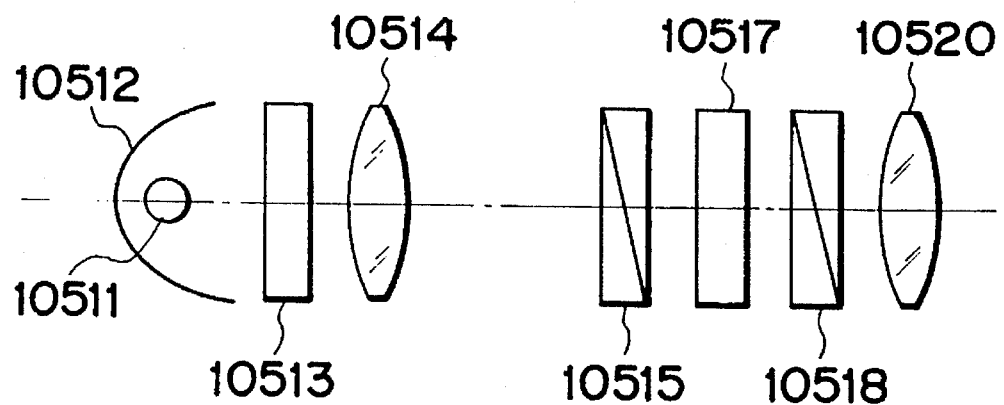
FIG. 1 shows the construction of the essential portions of a projector according to the prior art.
Figure 2:
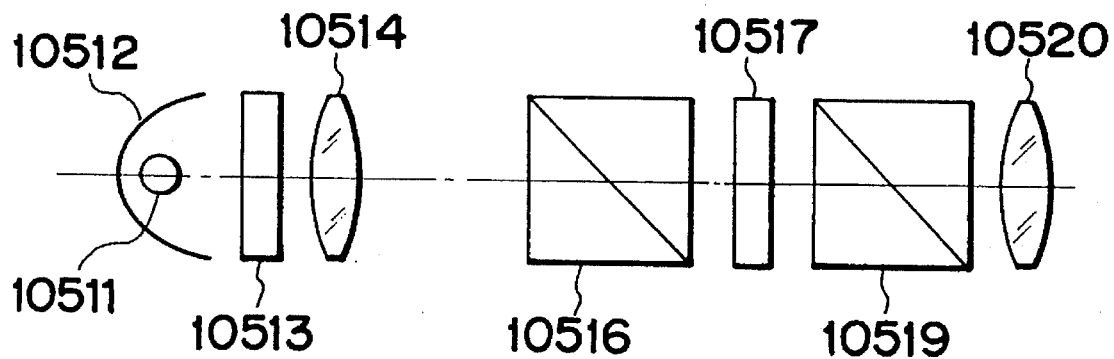
FIG. 2 shows the construction of the essential portions of a projector according to the prior art.

The difference of the projector of this embodiment from the prior-art projector shown in FIG. 1 is that the projector of this embodiment has a polarizing illuminating device 560 similar in construction to that shown in FIG. 1 as an illuminating optical system for converting parallel white light (non-polarized light) from a first condenser lens 564 into white linearly polarized light. In the projector of this embodiment, a second condenser lens 565 for condensing the white linearly polarized light from the polarizing illuminating device 560 in the pupil of a projection lens 568 is provided between the polarizing illuminating device 560 and a liquid crystal device 566.

The projector of the present embodiment illuminates the liquid crystal device 566 by the use of the polarizing illuminating device 560 and can therefore cause white light (non-polarized light) emitted from a light source 561 to enter the liquid crystal device 566 substantially without any loss.

Figure 12:
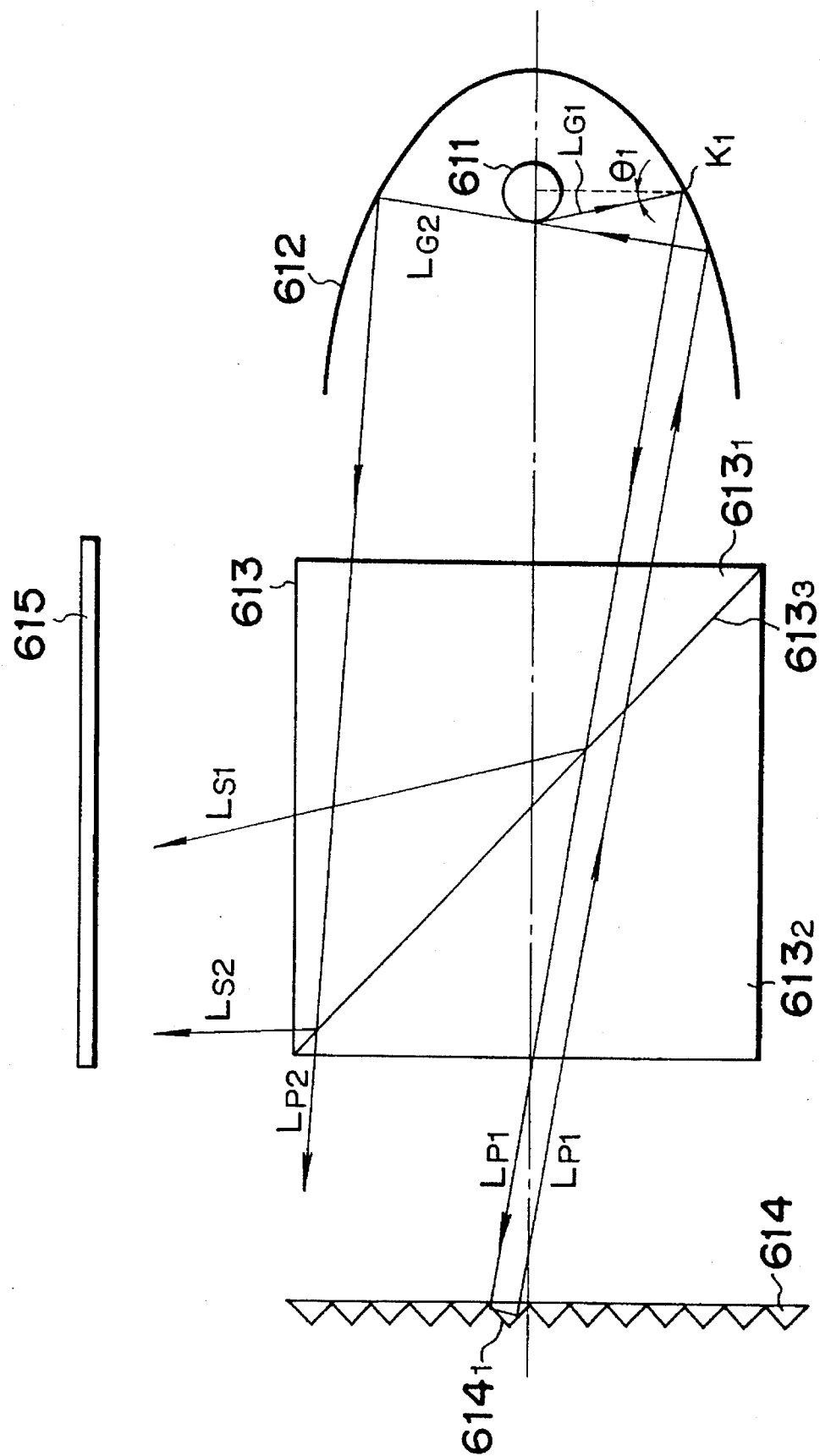
FIG. 12 shows yet still another embodiment of the polarizing illuminating device of the present invention.

FIG. 12 schematically shows the construction of an embodiment of the illuminating optical device of the present invention.

The illuminating optical device includes a light source 611 emitting radiation, a parabolic reflector 612 for converting the radiation emitted from the light source 611 into parallel light, a polarizing beam splitter (polarizing separating element) 613 provided between the light source 611 and a liquid crystal device 615 (an object to be illuminated) for separating the parallel light into P-polarized light and S-polarized light, and a corner cube array 614 provided on the optical axis of the P-polarized light separated by the polarizing beam splitter 613 for changing the direction of travel of the P-polarized light by 180°.

The light source 611 is provided near the focus of the parabolic reflector 612. The polarizing beam splitter 613 is an ordinary one and includes first and second prisms $613_1$ and $613_2$ each having the shape of a right-angled triangular post, and polarizing and separating film $613_3$ provided between the first prism $613_1$ and the second prism $613_2$ and formed of optical dielectric multi-layers or the like. The polarizing beam splitter 613 generally has the function of separating light incident on the polarizing and separating layers $613_3$ at an angle of 45° into P-polarized light and S-polarized light, and transmitting the P-polarized light therethrough and reflecting the S-polarized light, and performs a similar function also to light of which the angle of incidence is about 45°. The liquid crystal device 615 is provided on the optical axis of the S-polarized light separated by the polarizing beam splitter 613.

Figure 13:
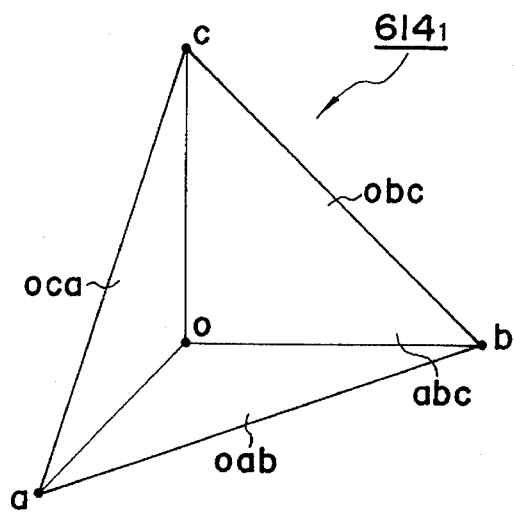
FIG. 13 schematically shows the construction of a corner cube shown in FIG. 12.

The corner cube array 614 is of a construction in which a plurality of unit corner cubes $614_1$ are continuously arranged. Each unit corner cube $614_1$, as shown in FIG. 13, comprises three reflecting surfaces (a first reflecting surface oab, a second reflecting surface obc and a third reflecting surface oca) orthogonal to one another, and a surface abc which provides an incidence surface and an emergence surface for light. Where the unit corner cube $614_1$ is filled with a refracting material such as glass, the first reflecting surface oab, the second reflecting surface obc and the third reflecting surface oca all effect total reflection. All of the first reflecting surface oab, the second reflecting surface obc and the third reflecting surface oca may be formed of mirrors. To make the array, the unit corner cubes $614_1$ can be arranged in such a manner that the surfaces abc thereof are on the same plane. The arraying will be easy to accomplish if at this time, the unit corner cubes $614_1$ are formed so that the surfaces abc thereof may become equilateral triangles.

The operation of the illuminating optical device of the present embodiment will now be described with reference to FIG. 12. Light $L_{G1}$ emitted from any point on the outer peripheral portion of the light source 611 of a finite size is incident on the reflecting point $K_1$ of the parabolic reflector 612 at an angle of $\theta_1$ with respect to the central ray. The light $L_{G1}$ reflected by the parabolic reflector 612 is incident on the polarizing and separating film $613_3$ of the polarizing beam splitter 613 at an angle of $45°+\theta_1$, but since the angle $\theta_1$ is such a degree of magnitude which does not greatly affect the separating performance of the polarizing and separating layers $613_3$, the light $L_{G1}$ is separated into P-polarized light $L_{P1}$ and S-polarized light $L_{S1}$. The S-polarized light $L_{S1}$ is incident on the liquid crystal device 615 and provides illuminating light for the liquid crystal device 615. Design is made such that the direction of orientation of the liquid crystal device 615 matches the direction of vibration (the direction of polarization) of the S-polarized light $L_{S1}$. On the other hand, the P-polarized light $L_{P1}$ is incident on a unit corner cube $614_1$ constituting the corner cube array 614, and has its direction of travel changed by 180° by this unit corner cube $614_1$. At this time, the direction of vibration of the P-polarized light $L_{P1}$ does not change. The P-polarized light $L_{P1}$ having had its direction of travel changed follows substantially the same optical path as the forward route and is again incident on the polarizing beam splitter 613, but since the direction of vibration thereof is the same as before, the P-polarized light $L_{P1}$ is transmitted through the polarizing and separating layers $613_3$, whereafter it is reflected by the parabolic reflector 612 and returns to substantially the same point as the emergence point of the light source 611.

The P-polarized light $L_{P1}$ which has returned to the light source 611 has its polarization disturbed by the scattering and refraction on the light source 611 and the reflection on the reflector 612 and becomes non-polarized light $L_{G2}$. The non-polarized light $L_{G2}$ is emitted toward the parabolic reflector 612 with the light source 611 as a secondary light source, and is incident on the parabolic reflector 612 at an angle of $\theta_1$ with respect to the central ray. The non-polarized light $L_{G2}$ is reflected by the parabolic reflector 612, whereafter it is separated into P-polarized light $L_{P2}$ and S-polarized light $L_{S2}$ by the polarizing beam splitter 613. The S-polarized light $L_{S2}$ is incident on the liquid crystal device 615 and provides illuminating light for the liquid crystal device 615 in the same manner as the aforedescribed S-polarized light $L_{S1}$. On the other hand, the P-polarized light $L_{P2}$ is incident on another unit corner cube $614_1$ constituting the corner cube array 614, and has its direction of travel changed by 180° by this unit corner cube $614_1$, whereafter it returns to substantially the same point as the emergence point of the light source 611 in the same manner as the aforedescribed P-polarized light $L_{P1}$. By the above-described operation being repeated, most of the light emitted from the light source 611 is converted into S-polarized light, Which provides illuminating light for the liquid crystal device 615.

Accordingly, in the illuminating optical device of the present embodiment, like the aforedescribed P-polarized light $L_{P1}$, light can be returned to the vicinity of the emergence point of the light source 611 by the use of the corner cube array 614 and therefore, the size of the secondary light source can be made substantially equal to the size of the light source 611 and thus, the loss of light can be decreased. Also, the heat generation around the liquid crystal device 615 by the loss of light can be prevented and a great heat reducing effect can be obtained.

Figure 14:
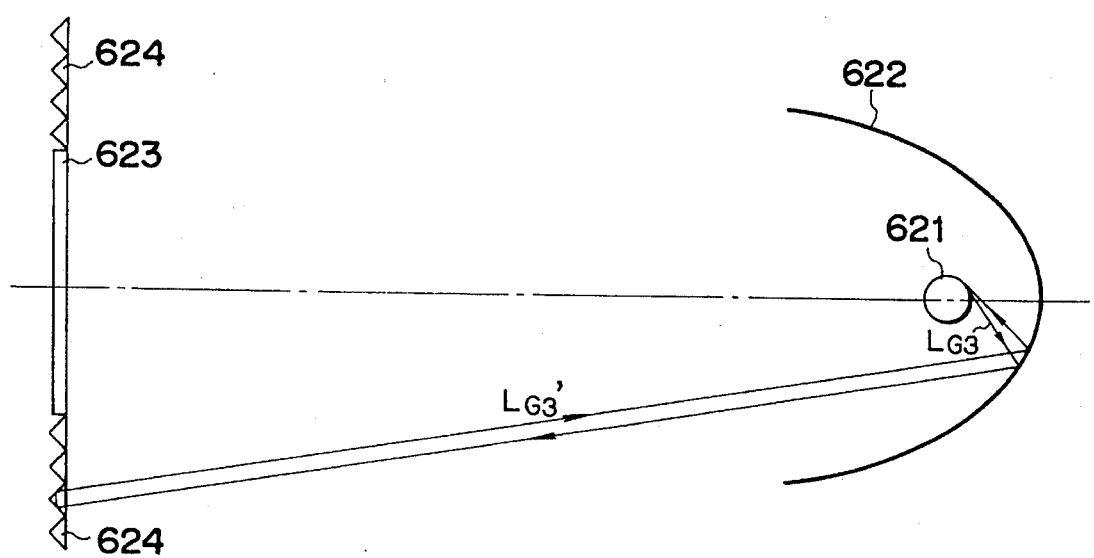
FIG. 14 shows an embodiment of the illuminating device of the present invention.

FIG. 14 schematically shows the construction of another embodiment of the illuminating optical device of the present invention.

Figure 4:
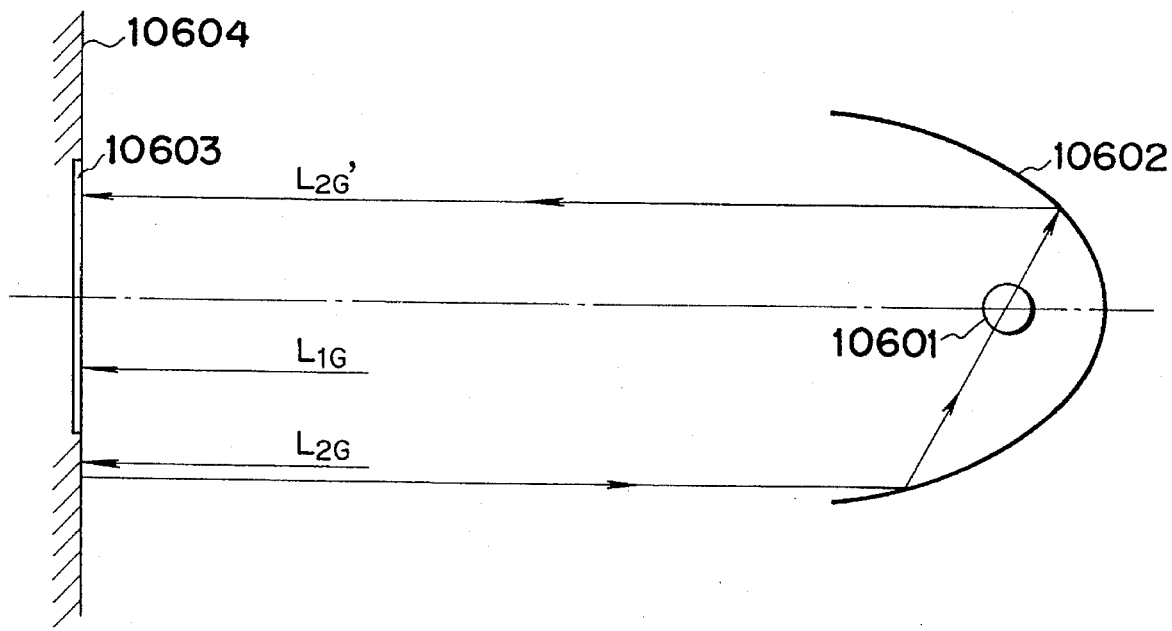
FIG. 4 shows an example of an illuminating device according to the prior art for causing light which does not illuminate an object to be illuminated to be imaged near a light source and reutilizing the image as a secondary light source.
Figure 5:
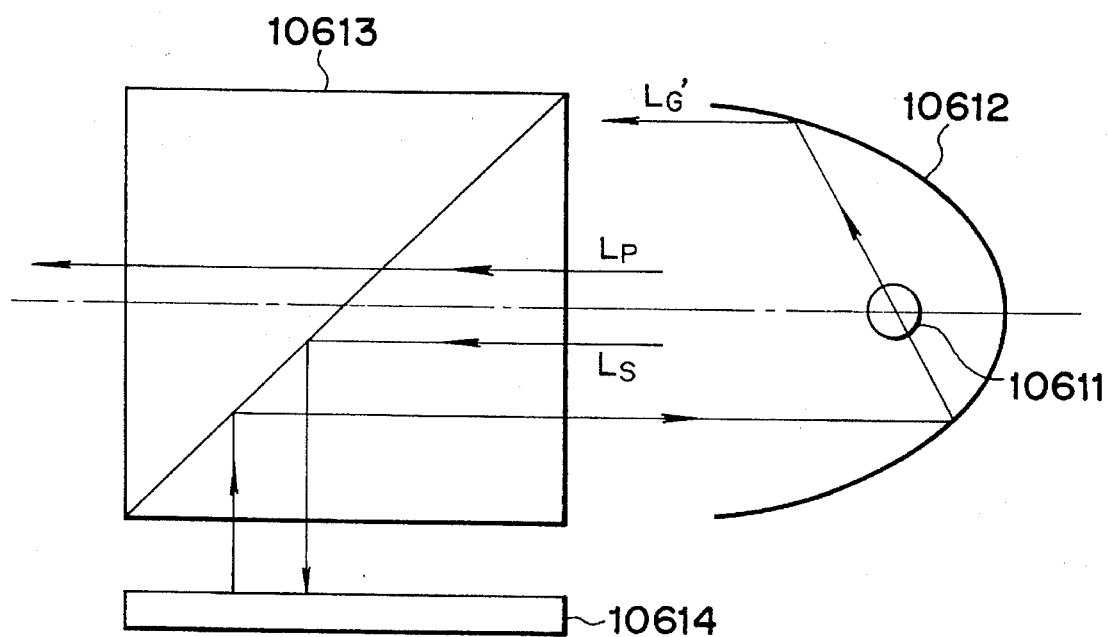
FIG. 5 shows an example of a polarizing illuminating device for causing light which does not illuminate an object to be illuminated to be imaged near a light source and reutilizing the image as a secondary light source.
Figure 6:
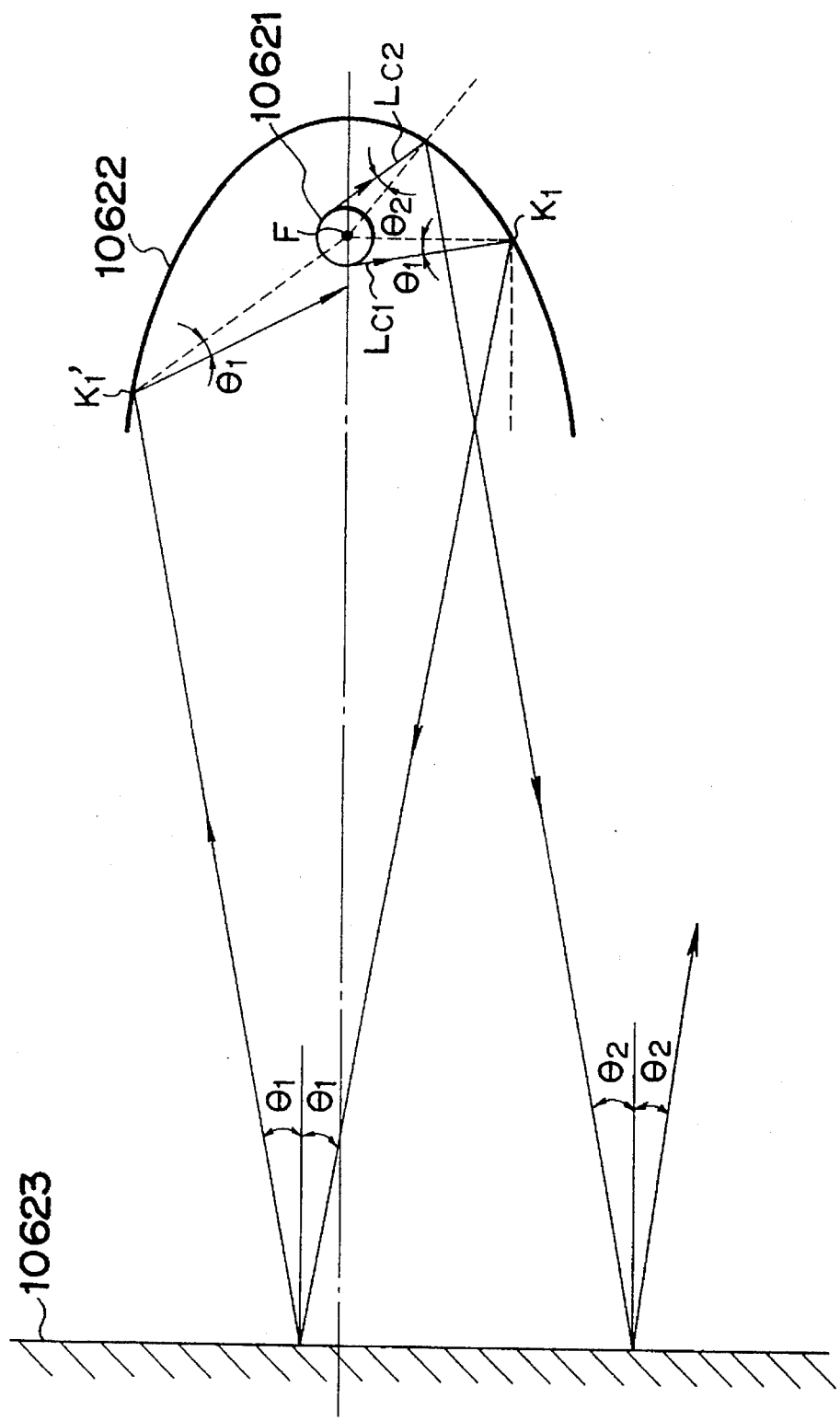
FIG. 6 illustrates the action of the device shown in FIG. 4 or 5.

The illuminating optical device of this embodiment differs from the prior-art illuminating optical device shown in FIG. 4 in that a corner cube array 624 is provided around a liquid crystal device 623 (an object to be illuminated).

Light $L_{G3}$ emitted from any point on the outer peripheral portion of a light source 621 is reflected by a parabolic reflector 622 and becomes parallel light, but since the light emission point of the light $L_{G3}$ does not coincide with the focus of the parabolic reflector 622, this light becomes light having a predetermined angle with respect to the central ray. Therefore, the light $L_{G3}$ does not illuminate the liquid crystal device 623 provided at a predetermined distance from the parabolic reflector 622, but illuminates the surroundings of the liquid crystal device 623. In the illuminating optical device of the present embodiment, however, the corner cube array 624 is provided around the liquid crystal device 623 and therefore, the light $L_{G3}$ has its direction of travel changed by the corner cube array 624 and travels as light $L_{G3}'$ toward the parabolic reflector 622. The light $L_{G3}'$ is reflected by the parabolic reflector 622 and returns to the vicinity of the light emission point of the light $L_{G3}$ of the light source 621, whereafter it provides illuminating light for the liquid crystal device 623 with the light source 621 as a secondary light source. Consequently, assuming that there is no loss such as absorption in the light emitted from the light source 621, all the light emitted from the light source 621 finally provides illuminating light for the liquid crystal device 623.

The light $L_{G3}'$ which has returned to the light source 621 is more or less scattered by the light source 621 and therefore, the optical path of the light $L_{G3}'$ does not become a monotonous optical path.

An embodiment of the projector of the present invention will now be described.

An embodiment of the projector of the present invention can be constructed by providing a projection lens (not shown) for projecting the light transmitted through the liquid crystal device 623 onto a screen (not shown) on that side of the liquid crystal device 623 of the illuminating optical device shown in FIG. 14 which is opposite to the light source 621.

In the embodiment of FIG. 12, the mirror surface polishing process as shown in FIGS. 7 to 10 may be carried out.

Also, a single large corner cube may be used in lieu of the corner cube array, and an cat's eye optical system may also be used to obtain a similar effect.

The present invention, which is constructed as described above, has the following effects.

The incidence surface for non-polarized light, the emergence surface for two polarized lights having their directions of polarization made equal to each other, and all surfaces parallel to the optical axis of non-polarized parallel light are polished, whereby even if the light source is not an ideal point light source, the incident non-polarized light can be converted into polarized light without any loss of the quantity of light and also, the two polarized lights having had their directions of polarization made equal to each other can be made to emerge from the emergence surface without any loss of the quantity of light and therefore, any loss of the quantity of light can be prevented.

The illuminating optical device of the present invention includes a corner cube array for changing the direction of travel of the light which does not illuminate the object to be illuminated by 180°, whereby the light of the radiation emitted from the light source which does not illuminate the object to be illuminated can be returned to the light source to thereby form a secondary light source of substantially the same size as the light source and thus, the utilization efficiency of light can be improved.

A projector having the illuminating device or polarizing illuminating device of the present invention has high utilization efficiency of light and therefore can achieve higher luminance of images.

Optionally in each embodiment, transparent high reflectivity optical member is more preferably used for each optical member. Further each polished surface may be polished into a mirror surface.

What is claimed is:

1. An illuminating apparatus for illuminating an object with light, said apparatus comprising:

a light source;

a concave mirror for reflecting light from said light source, wherein said reflected light has a light beam illuminating the object and another light beam illuminating an area other than the object; and a corner cube for reflecting said another light beam toward said concave mirror so that a portion of said another light beam illuminates said object.

2. An illuminating device according to claim 1, wherein said corner cube has a plurality of corner cube arrays provided on one and the same plane.

3. An illuminating device according to claim 2, wherein said corner cube arrays are provided around at the peripheral portion of said object to be illuminated.

4. An illuminating device according to claim 2, wherein a polarizing separating element for separating the light from said light source into first polarized light and second polarized light is provided between said light source and said object to be illuminated, and said corner cube arrays are provided in the optical path of said separated first or second polarized light.

5. An illuminating device according to claim 4, wherein said polarizing separating element is a polarizing beam splitter comprising a combination of two triangular prisms provided with polarizing and separating film on the slope thereof, and at least a portion of that surface of the outer peripheral portion of said polarizing beam splitter which is parallel to the optical path of the incident light functioning as a reflection surface.

6. A projector comprising:

a light source;

a reflector for reflectively collimating light from said light source;

image forming means for forming an image by modulating the collimated light from said reflector in accordance with a video signal; and projecting means for projecting the image formed by said image forming means, wherein said projector further comprises a corner cube array for reflecting a light beam from said reflector which illuminates an area other than said image forming means and for directing it to said reflector so that a portion of the light beam illuminates said image forming means.

7. A projector comprising:

a light source;

a concave mirror for reflecting light from said light source, wherein said reflected light has a light beam illuminating an image generator and another light beam illuminating an area other than the image generator;

a projection optical system for projecting an image generated by said image generator; and a corner cube for reflecting said another light beam toward said concave mirror so that a portion of said another light beam illuminates said image generator.

8. A projector comprising:

a light source;

a concave mirror for reflecting light from said light source, wherein said reflected light has a light beam illuminating an image generator and another light beam illuminating an area other than the image generator;

a projection optical system for projecting an image generated by said image generator; and a corner cube array for reflecting said light beam illuminating an area other than the image generator toward said concave mirror so that a portion of said light beam illuminates said image generator.

* * * * *

UNITED STATES PATENT AND TRADEMARK OFFICE
CERTIFICATE OF CORRECTION

PATENT NO. : 5,590,942
DATED : January 7, 1997
INVENTOR(S) : Kimura et al.

It is certified that error appears in the above-indentified patent and that said Letters Patent is hereby corrected as shown below:

Column 9, line 66, after "rectangular" delete the hyphen (-).

Column 12, line 48, change "Which" to --which--.

Signed and Sealed this

Sixth Day of May, 1997

BRUCE LEHMAN

*Attest:*

*Attesting Officer*              *Commissioner of Patents and Trademarks*